United States Patent
Bohn et al.

(10) Patent No.: US 8,536,940 B2
(45) Date of Patent: Sep. 17, 2013

(54) METHOD FOR AMPLIFYING A SIGNAL BY A POWER AMPLIFIER, POWER AMPLIFIER SYSTEM, DEVICE, COMPUTER PROGRAM PRODUCT, AND DIGITAL STORAGE MEDIUM THEREOF

(75) Inventors: Thomas Bohn, Stuttgart (DE); Christoph Haslach, Stuttgart (DE); Xin Yu, Stuttgart (DE); Gerhard Luz, Bietigheim-Bissingen (DE)

(73) Assignee: Alcatel Lucent, Paris (FR)

( * ) Notice: Subject to any disclaimer, the term of this patent is extended or adjusted under 35 U.S.C. 154(b) by 14 days.

(21) Appl. No.: 13/254,358

(22) PCT Filed: Feb. 10, 2010

(86) PCT No.: PCT/EP2010/051641
§ 371 (c)(1),
(2), (4) Date: Sep. 1, 2011

(87) PCT Pub. No.: WO2010/100016
PCT Pub. Date: Sep. 10, 2010

(65) Prior Publication Data
US 2011/0316623 A1    Dec. 29, 2011

(30) Foreign Application Priority Data
Mar. 2, 2009   (EP) ..................................... 09305185

(51) Int. Cl.
*H03G 3/20*   (2006.01)
(52) U.S. Cl.
USPC .......................................... 330/127; 330/136

(58) Field of Classification Search
USPC ................................ 330/127, 136; 455/127.1
See application file for complete search history.

(56) References Cited

U.S. PATENT DOCUMENTS

| | | | |
|---|---|---|---|
| 5,570,062 A | 10/1996 | Dent | |
| 6,028,486 A | 2/2000 | Andre | |
| 6,437,641 B1 | 8/2002 | Bar-David | |
| 6,741,127 B2 | 5/2004 | Sasho et al. | |
| 7,525,377 B2 * | 4/2009 | Altham et al. | ................. 330/136 |
| 2004/0218689 A1 | 11/2004 | Akhtman | |
| 2006/0094475 A1 | 5/2006 | Haberland et al. | |

FOREIGN PATENT DOCUMENTS

| | | |
|---|---|---|
| EP | 1 916 765 A2 | 4/2008 |
| GB | 2 366 461 A | 3/2002 |
| GB | 2 395 077 A | 12/2004 |
| JP | 2000-244452 | 9/2000 |
| JP | 2002-314345 | 10/2002 |
| JP | 2006-352635 | 12/2006 |
| WO | WO 2007/143843 A1 | 12/2007 |
| WO | WO 2008/072700 | 6/2008 |

OTHER PUBLICATIONS

International Search Report for PCT/EP2010/051641 dated Mar. 17, 2010.

(Continued)

*Primary Examiner* — Steven J Mottola
(74) *Attorney, Agent, or Firm* — Fay Sharpe LLP

(57) ABSTRACT

The invention relates to a method for amplifying a carrier signal (CS1) by using a power amplifier (PA1), the power amplifier (PA1) is feed with a supply voltage (PASV1) of a power supply (SMPS1). The method comprises the step of adapting a value of the supply voltage (PASV1) to a value related to a mean signal power of an input signal (DS) of a power amplifier system (PAS1).

14 Claims, 13 Drawing Sheets

(56) References Cited

OTHER PUBLICATIONS

Thomas Bohn, Dieter Ferling, Patrick Juschke, Anton Ambrosy, Sven Petersson, Magnus Olsson, Pal Frenger, Ylva Jading, Aykut Erdem, Philippe Maugars, Sebastian Pla, Dick Buthker, Shinji Mitzuta, Guido Dietl. Mauro Boldi, Maurizio Crozzoli, Daniel Disco, Maurizio Fodrini, Emilio Calvanese-Strinati, Rohit Gupta, Alexandre Giry, Laurent Dussopt, Yinan Qi, Vito Giannina, Claude Dessert, Min Li, Bjorn DeBaillie, Rodolfo Torrea, Filipe Cardoso, Luis Correia, Custodio Peizeiro, Jouko Leinonen, Manual J. Gonzalez, "Most promising tracks of green radio technologies", pp. 1-96, Dec. 31, 2010.

T. Nechiporenko and Ha H. Nguyen, "Optimal clipping value for PAR reduction of OFDM", pp. 1335-1339, 2007 IEEE.

Hideki Ochiai, "Amplifier efficiencies of OFDM systems with peak power and envelope variance reduction", pp. 828-833, 2006 IEEE.

K.C. Chen, K.A. Morris, and M.A. Beach, "Increasing the power efficiency of an IEEE802.11a Power Amplifier", 2005 IEEE.

Shreyas Sen, Vishwanath Natarajan, Rajarajan Sengutttuvan, Abhijit Chatterjee, "Pro-Visor: Process tunable virtually zero margin low power adaptive RF for wireless systems", Georgia Institute of Technology, Jun. 11, 2008.

O. Vaananen, J. Vankka and K. Halonen, "Simple algorithm for peak windowing and its application in GSM, EDGE and WCDMA Systems", IEE Proc. Commun., vol. 152, No. 3, Jun. 2005.

Ferling et al., "Energy efficiency approaches for radio nodes", Future Network and Mobile Summit, Jun. 16-18, 2010, pp. 1-9.

Gonzalez, et al., "Concepts for energy efficient LTE transceiver systems in macro base stations", Future Network and Mobile Summit, Jun. 15-17, 2011, pp. 1-8.

Helaoui et al., "DSP-based technique for power efficiency improvement in low-IF FHz WLAN transmitter", Microwave Conference, Oct. 4-6, 2005, vol. 3, pp. 1-4.

IEEE Xplore Abstract showing conference date for AG, Jan. 10, 2013.

IEEE Xplore Abstract showing conference date for AH, Jan. 10, 2013.

IEEE Xplore Abstract showing conference date for AJ, Jan. 10, 2013.

* cited by examiner

METHOD FOR AMPLIFYING A SIGNAL BY A POWER AMPLIFIER, POWER AMPLIFIER SYSTEM, DEVICE, COMPUTER PROGRAM PRODUCT, AND DIGITAL STORAGE MEDIUM THEREOF

FIELD OF THE INVENTION

The invention relates to a method for amplifying a carrier signal by using a power amplifier, to a power amplifier system, and to a computer program product.

BACKGROUND OF THE INVENTION

Modern radio communication systems such as LTE (LTE=long term evolution) being developed by 3GPP (3GPP=Third Generation Partnership) or WiMAX (WiMAX=Worldwide Interoperability for Microwave Access) being developed by IEEE (IEEE=Institute of Electrical and Electronics Engineers) and by WiMAX Forum use modulation techniques such as OFDM (OFDM=orthogonal frequency division multiplexing) with an enhanced spectral efficiency.

An alterable envelope of OFDM signals exhibit a large dynamic range. The large dynamic range provides high demands on digital-analog/analog digital converters regarding digital resolution and high demands according to a linear amplification of the OFDM signals by a power amplifier.

The dynamic range is defined by a peak-to-average-power ratio (PAPR=peak-to-average-power ratio), which is a ratio of a maximum instantaneous power to an average power.

The power an is designed to provide amplification for a highest arising value of an input power. Thereby, the power amplifier, being operated with a constant DC bias current (DC=direct current) of a power supply, works only with a highest efficiency according to the highest arising value of the input power or according to a so-called peak power. But most of the time, the input power is only a fraction of the peak power. This means, for long time periods an output power of the power amplifier is only a fraction of the power consumption of the power supply resulting in low power efficiency. Especially during time periods of low user traffic, such as time of night from midnight to 6 am, the power efficiency is quite low. Several solutions exist to improve the power efficiency of the power amplifier.

A PAPR reduction algorithm can be used to limit the peak power. In that way, the power amplifier is not designed according to the peak power but according to a pre-defined constant so-called clipping threshold, which is lower than the peak power. A so-called clipping removes signal peaks of the input signal, which are above the clipping threshold. Therewith, the power efficiency of the power amplifier can be improved. But an improvement can only be achieved for high load situations. During low load situations the efficiency is still quite low. A further disadvantage is a decreasing signal quality of the output signal of the power amplifier, because cutting the signal peaks increases an SNR (SNR=signal-to-noise-ratio) and increases the spectral bandwidth of the output signal.

An envelope tracking method is a further optimisation technique for the power amplifier by controlling the supply voltage of the power amplifier in real time depending on the current amplitude of the envelope of the input signal. Theoretically, a highest power efficiency of the power amplifier can be achieved by this technique. But complexity of transmitter design increases significantly because supplementary components such as coupler, detector, delay/synchronisation element, high-bandwidth voltage modulator or complex digital signal algorithm are required. In addition, a control of the envelope frocking method for a high bandwidth input signal such as 20 MHz bandwidth needs strong technical requirements on the supplementary components, In DE 601 00 753 T2 a method for improving the efficiency and the dynamic range of a power amplifier is disclosed. A supply voltage is generated by a first power supply with low output voltage if an input signal is below a reference level and generated by a second power supply with high output voltage if the input signal is above the reference value.

The way of controlling the power supply of the power amplifier affects the power efficiency of the power amplifier.

Therefore, it is the object of the invention to improve the power efficiency of the power amplifier.

SUMMARY OF THE INVENTION

This object is achieved by a method for amplifying a carrier signal by using a power amplifier of a power amplifier system, the power amplifier is fed with a supply voltage of a power supply, wherein the method comprises the step of adapting a value of the supply voltage to a value related to a mean signal power of an input signal of a power amplifier system, and wherein the method further comprises the step of limiting signal peaks of the input signal according to a clipping threshold and wherein the clipping threshold is determined by the value related to the mean signal power.

The object is further achieved by a power amplifier system, and by a computer program product.

The method according to the present invention offers a benefit of reducing the power consumption of the power amplifier, because the DC bias current of the power amplifier is always limited to a value, which is sufficient to amplify the input signal with a power value equal to the mean signal power. Furthermore, an overall power consumption of the power amplifier system con be reduced.

In comparison to an envelope tracking method, the invention needs no delay/synchronisation element in an input path of the power amplifier to synchronize a voltage modulation of a power supply with a real time envelope of the input signal. Furthermore, supplementary components such as coupler, detector, the delay/synchronisation element, complex digital signal algorithmic, which are used in the envelope tracking method, are not required.

Variations of the supply voltage are performed in a much longer time in comparison to the envelope tracking method, because the mean signal power has a lower frequency bandwidth than the real time envelope of the input signal. Therewith, technical requirements according to the components used for the invention are lower than for components used regarding the envelope tracking method.

In a preferred embodiment of the invention, the input signal is a digital input signal or an analogue input signal.

Thereby, the invention can be used for power amplifier systems with digital input signals as well as for power amplifier systems with analogue input signals.

In a further preferred embodiment of the invention, the method further comprises the step of keeping a peak-to-overage-power-ratio of the input signal in a predefined range. This provides the advantage of avoiding a saturation of the amplification of the power amplifier by signal peaks with a signal power much larger than the mean signal power. Furthermore, distortions of the output signal of the power amplifier such as generation of additional sidebands caused by the saturation of the amplification can be prevented. The predefined range can be selected in such a way, that requirements such as given by a radio communication standard regarding signal integrity are fulfilled.

In an even further preferred embodiment of the invention, the adaptation of the supply voltage is performed with a value of an ascending slope above an absolute value of a downward slope. This further embodiment reduces on the one hand the number of adaptation steps. On the other hand, an adaptation of the supply voltage to fast ascents of the mean signal power is enabled to avoid a saturation of the amplification of the power amplifier by a fast increase of the mean input power.

In another preferred embodiment of the invention, the method further comprises the steps of measuring values of the input signal with a first predefined time interval and calculating the value related to the mean signal power using the values of the input signal measured within a second predefined time interval. By using this embodiment, data can be gathered directly from a physical layer to calculate the mean signal power of the input signal. This provides the advantage of achieving a shaft-time adaptation of the supply voltage.

In an even further preferred embodiment of the invention, the method further comprises the step of receiving a data traffic indication from a higher-layer entity. This provides the benefit of a timely adaptation of the supply voltage before the amplitude of the envelope of the input signal of the physical layer is increased in a fast way by an alteration of the user traffic or the signalling traffic volume.

In yet another preferred embodiment of the invention, the method further comprises the step of measuring at least one value of at least one further characteristic of at least one further signal and the at least one further characteristic is a quality indicator of the at least one further signal.

This provides the advantage of adjusting the value of the supply voltage and/or the peak-to-average-power-ratio in a more accurate way, so that a signal quality of the amplified carrier signal can be optimised.

Further advantageous features of the invention are defined by dependent claims for the method and for the power amplifier system and by independent claims for a computer program product, for a device, and for a digital storage medium.

BRIEF DESCRIPTION OF THE DRAWINGS

The embodiments of the invention will become apparent in the following detailed description and will be illustrated by accompanying drawings given by way of non-limiting illustrations.

DETAILED DESCRIPTION OF THE INVENTION

Figure 1:
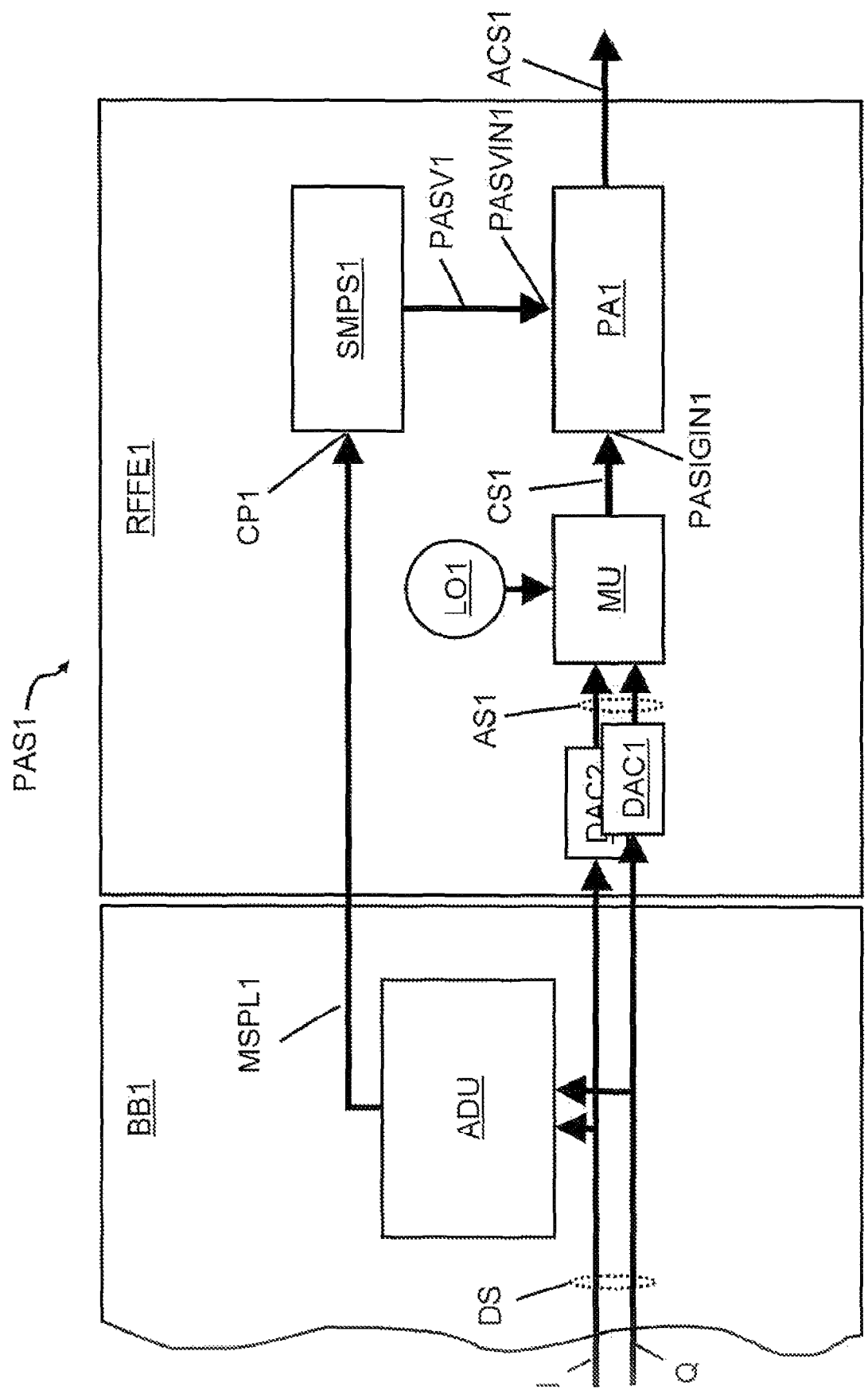
FIG. 1 shows a block diagram of a power amplifier system in accordance to a first application of a first embodiment of the invention.

FIG. 1 shows a block diagram of a power amplifier system PAS1 according to a first application of a first embodiment of the invention. The power amplifier system PAS1 may be contained in a transmitter of a network element of a radio communication system such as an LTE system (LTE=Long Term Evolution), a WiMAX system (WiMAX=Worldwide Interoperability for Microwave Access), or a WLAN system (WLAN=Wireless Local Area Network).

The network element is for example a base station. Further alternatives for the network element are an access point, a mobile phone, a PDA (PDA=personal digital assistant), a notebook etc.

In an alternative, the power amplifier system PAS1 may be contained in a transceiver of a fixed access communication system such as ADSL (ADSL=Asymmetric Digital Subscriber Line).

In a further alternative, the power amplifier system PAS1 may be contained in an audio or a video system such as a hi-fi system.

Generally, the power amplifier system PAS1 according to the first embodiment of the invention may be used in any application, where an amplification of an electromagnetic signal is required.

A digital baseband board BB1 generates a complex digital input signal DS comprising an inphase signal part I and a quadrature signal part Q.

In an alternative, the digital baseband board BB1 may generate a real digital input signal comprising a single real port.

The power amplifier system PAS1 comprises an analogue RF front end (RF=radio frequency) RFFE1 and a portion of the digital baseband board BB1 and.

In an alternative, the power amplifier system PAS1 may comprise a further digital baseband board and the analogue RF front end RFFE1.

The portion of the digital baseband board BB1 may comprise an adaptation unit ADU such as an FPGA (FPGA=field-programmable gate array), a CPLD (CPLD=complex programmable logic device), an ASIC (ASIC=application specific integrated circuit) or a DSP (DSP=digital signal processor).

The RF front end RFFE1 may comprise two DACs (DAC=digital-to-analogue converter) DAC1, DAC2, a modulation and upconversion module MU1, a local oscillator LO1, a power supply SMPS1, and a power amplifier PA1.

In an alternative, a location of the DACs DAC1, DAC2 is shifted from the RF front end RFFE1 to the baseband board BB1.

The digital input signal DS is a signal of a transmission method such as OFDM (OFDM=orthogonal frequency division multiplexing), CDMA (CDMA=code division multiple access), WCDMA (WCDMA=wideband CDMA), or multi-carrier GSM (GSM=Global System for Mobile Communications).

In on alternative, the digital input signal represents an audio or video signal of an audio or video system.

A signal path of the quadrature signal part Q of the digital input signal DS is connected to an input interface of the first DAC DAC1 and a signal path of the inphase signal part I is connected to an input interface of the second DAC DAC2. Furthermore, both signal paths are connected to input interfaces of the adaptation unit ADU.

In an alternative, a single signal path of a real signal is connected to a single DAC and to an adaptation unit comprising a single input interface. Output interfaces of the two DACs DAC1, DAC2 for an inphase and a quadrature signal part I, Q of an analogue signal AS1 are connected to input interfaces of the modulation and upconversion module MU. The local oscillator LO1 is connected to a further input interface of the modulation and upconversion module MU.

An output interface of the modulation and upconversion module MU for a carrier signal CS1 is connected to a signal input interface PASIGIN1 of the power amplifier PA1.

The adaptation unit ADU calculates a value MSPL1 related to a mean signal power of the digital input signal DS, which is used at the power supply SMPS1 to adapt a value of a supply voltage PASV1 of the power supply SMPS1.

An output interface of the adaptation unit ADU is connected to a control port CP1 of the power supply SMPS1.

The control port CP1 may be a digital control port.

In an alternative, the control port CP1 may be an analogue control port and a further DAC may be used between the adaptation unit ADU and the power supply SMPS1 to convert digital values coming from the adaptation unit ADU to analogue values.

The power supply SMPS1 may be a switched-mode power supply providing the advantage of generating the supply voltage PASV1 at different power levels with a same high efficiency.

In on alternative, the power supply SMPS1 may be a voltage modulator such as used in an envelope tracking method.

The power supply SMPS1 adopts the value of the supply voltage PASV1 to the value MSPL1 received via the control port CP1.

An output interface for the supply voltage PASV1 of the power supply SMPS1 is connected to a voltage input interface PASVIN1 of the power amplifier PA1.

The power amplifier PA1 amplifies the carrier signal CS1 to an amplified carrier signal ACS1 based on the adapted value of the supply voltage PASV1.

This provides the advantage of increasing a power efficiency of the power amplifier PA1 and thereby reducing the overall power consumption of the power amplifier system PAS1.

Figure 2:
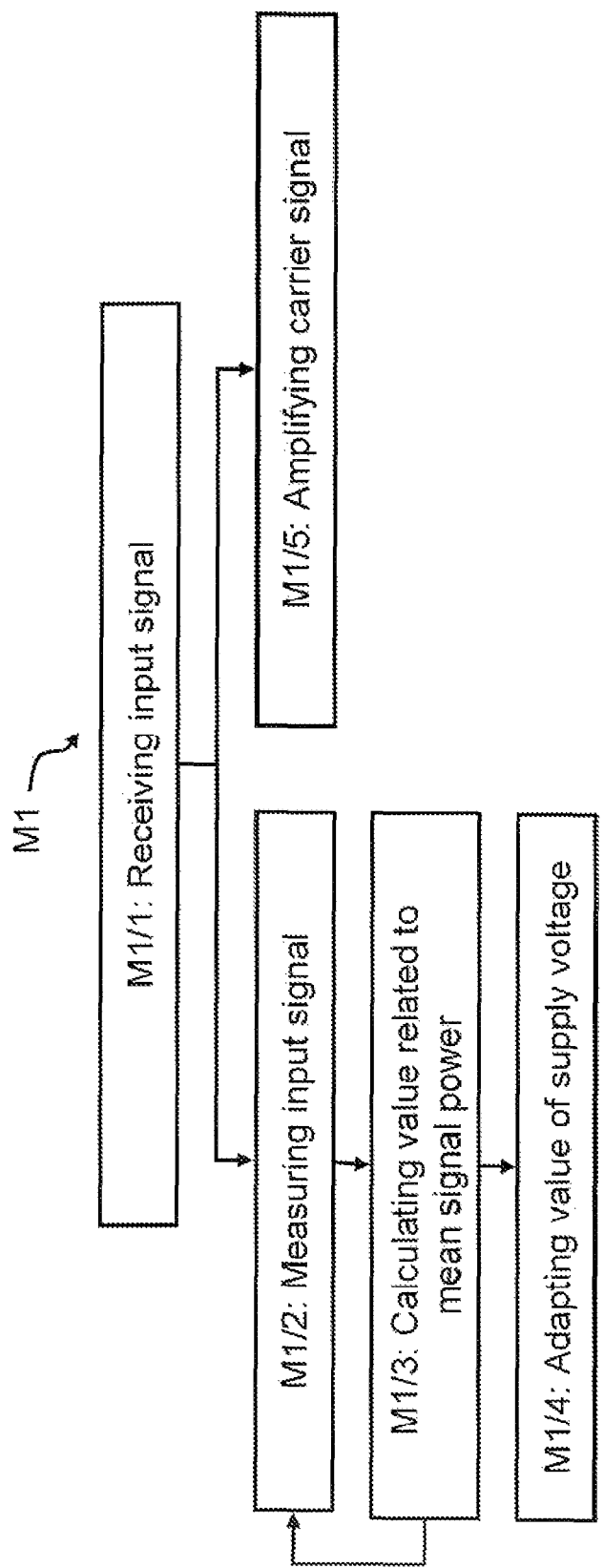
FIG. 2 shows a flow diagram of a method in accordance to the first application of the first embodiment of the invention.

Referring to FIG. 2 a flow diagram of a method M1 in accordance to the first application of the first embodiment of the invention is shown.

The sequence and the number of the steps for performing the method M1 is not critical, and as can be understood by those skilled in the art, that the sequence and the number of the steps may vary without departing from the scope of the invention.

In a first step M1/1, the inphase and the quadrature signal parts I, Q of the digital input signal DS are received by the portion of the digital baseband board BB1 comprising the adaptation unit ADU.

The stop M1/1 is continuously performed.

In a next step M1/2, the adaptation unit ADU measures and stores values of the inphase and the quadrature signal parts I, Q of the digital input signal DS at certain points of time, which are given by a first predefined time interval.

In an alternative, the adaptation unit ADU continuously measures sand stores all values of the inphase and the quadrature signal parts I, Q of the digital input signal DS.

In a further step M1/3, the adaptation unit ADU calculates the value MSPL1 related to the mean signal power of the digital input signal DS.

In a first substep, the adaptation unit ADU squares the inphase and the quadrature signal parts I, Q and adds the squares of the inphase and the quadrature signal ports I, Q for an intermediate value.

In a second substep, the adaptation unit ADU calculates the value MSPL1 related to the mean signal power of the digital input signal DS by averaging intermediate values of the first substep, which belong to a second predefined time interval. The second predefined time interval is equal or larger than the first predefined time interval.

The value MSPL1 related to the mean signal power may be based on an arithmetic mean of absolute values of signal amplitudes of the digital input signal DS.

In further alternatives, the value MSPL1 related to the mean signal power may be based on a quadratic mean of power amplitudes of the digital input signal DS, on a generalized mean of the digital input signal DS, or on a moving average of the digital input signal DS.

In a further preferred alternative, the moving average of the digital input signal DIS uses a lower weight, according to the value of the digital input signal DS measured within a first part of the second predefined time interval and a higher weight according to the values of the digital input signal DS measured within a second part of the second predefined time interval and the first part of the second predefined time interval is followed by the second part of the second predefined time interval. Thereby, the value MSPL1 related to the mean signal power stronger depends on recently measured values and can react according to abrupt changes in a faster time.

The step M1/2 is repeated after the step M1/3.

A step M1/4 is followed by the step M1/3, if the value MSPL1 related to the mean signal power has been changed according to a preceding calculation of the value MSPL1 related to the mean signal power.

In a preferred alternative, the step M1/4 is followed by the step M1/3, if the value MSPL1 related to the mean signal power has been changed by a predefined amount according to the preceding calculation of the value MSPL1 related to the mean signal power.

In a further alternative, the step M1/4 is always followed by the step M1/3. In a next step M1/4, a value of the supply voltage PASV1 of the power amplifier PA1 is adapted to the value MSPL1 related to the mean signal power of the digital input signal DS.

The value MSPL1 related to the mean signal power is a mean signal power level and the voltage supply SMPS1 determines the value of the supply voltage PASV1 for example by using a look-up table of the voltage supply SMPS1 or by using an equation with a relation between the value of the supply voltage PASV1 and the mean signal power level.

In a further alternative, the value MSPL1 related to the mean signal power is a specific value required by the control port CP1 to extract a specific supply voltage PASV1. Therefore, the adaptation unit ADU calculates the specific value by using a look-up table of the adaptation unit ADU. This provides the advantage of not requiring an internal logic within the voltage supply SMPS1 and provides the advantage of a higher flexibility in using power supplies due to an independence on a specific control language of the control port.

In an even further alternative, the value MSPL1 related to the mean signal power is an increment value of the supply voltage PASV1 by using a further look-up table of the adaptation unit ADU. The power supply SMPS1 changes the supply voltage PASV1 according to the received increment value. This provides the advantage of applying values to the power supply SMPS1 with a higher resolution.

Preferably, the adaptation unit ADU adapts the value of the supply voltage PASV1 with a value of on ascending slope above an absolute value of a downward slope. Thereby, the supply voltage PASV1 can be faster increased than decreased.

This provides the advantage of reducing on the one hand the number of adaptation steps. On the other hand, an adaptation of the supply voltage PASV1 to fast ascents of the mean signal power level MSPL1 is enabled to avoid a saturation of the amplification of the power amplifier PA1 by a fast increase of the mean input power level MSPL1.

In a further step M1/5, which is executed continuously and in parallel to the steps M1/2, M1/3 and M1/4, the power amplifier PA1 amplifies the digital input signal DS to on amplified carrier signal ACS1.

The further step M1/5 for a same digital input signal DS is usually executed before the step M1/4 is finished. Therefore, the amplification of the inphase and the quadrature signal parts I, Q of the some digital input signal DS is performed with a former adapted value of the supply voltage PASV1 of the power amplifier PA1.

The amplification of the inphase and the quadrature signal parts I, Q of further received digital input signals DS is performed with a new adapted value of the supply voltage PASV1 of the power amplifier PA1 according to the step M1/4 not until the step M1/4 is finished.

In a first sub-step, the inphase and the quadrature signal parts I, Q of the digital input signal DS are converted by the DACs DAC1 DAC2 to an analogue signal AS1.

In a further sub-step, the modulation and upconversion module MU modulates the inphase and the quadrature signal parts I, Q of the analogue signal AS1 to an intermediate signal and converts the intermediate signal to the carrier signal CS1 by mixing the intermediate signal with a frequency signal of the local oscillator LO1.

In an alternative, a modulation of the inphase and the quadrature signal parts I, Q of the digital input signal DS may be performed by a baseband or IF modulator (IF=intermediate frequency) located on the baseband board BB1 and only an upconversion is performed via the RF front end RFFE1.

In a final sub-step, the carrier signal CS1 is amplified to the amplified carrier signal ACS1 in accordance to the supply voltage PASV1 of the power amplifier PA1.

The amplified carrier signal ACS1 is transmitted to an antenna, which is connected to an output interface of the power amplifier PA1.

In an alternative, the amplified carrier signal ACS1 may be inserted to a fixed transmission line.

In a further alternative, the amplified carrier signal ACS1 may be transmitted to loudspeakers of the audio or video system.

By the method M1 according to the first application of the first embodiment of the invention, a predetermined supply voltage PASV1 power is applied to the power amplifier PA1 according to a predetermined mean signal power. Generally, for an increasing mean signal power an increasing supply voltage PASV1 and for a decreasing mean signal power a decreasing supply voltage PASV1 is applied to the power amplifier PA1.

This provides a benefit of reducing the power consumption of the power amplifier PA1, because a CD bias current of the power amplifier PA1 is always limited to a value, which is sufficient to amplify the carrier signal CS1 having a power level related to the mean signal power.

In comparison to an envelope tracking method, the method needs no delay/synchronisation element in an input signal path of the power amplifier PA1 to synchronize a voltage modulation of a power supply with a real time amplitude of an envelope of the digital input signal DS.

Furthermore, supplementary components such as coupler, detector, the delay/synchronisation element, complex digital signal algorithmic, which are used in the envelope tracking method, are not required.

Variations of the supply voltage are preformed in a much longer time in comparison to the envelope tracking method, because the mean signal power has a lower frequency bandwidth than the real time amplitude of the envelope of the digital input signal DS. Therewith, technical requirements according to the components used for the invention are lower than for components used regarding the envelope tracking method.

Figure 3:
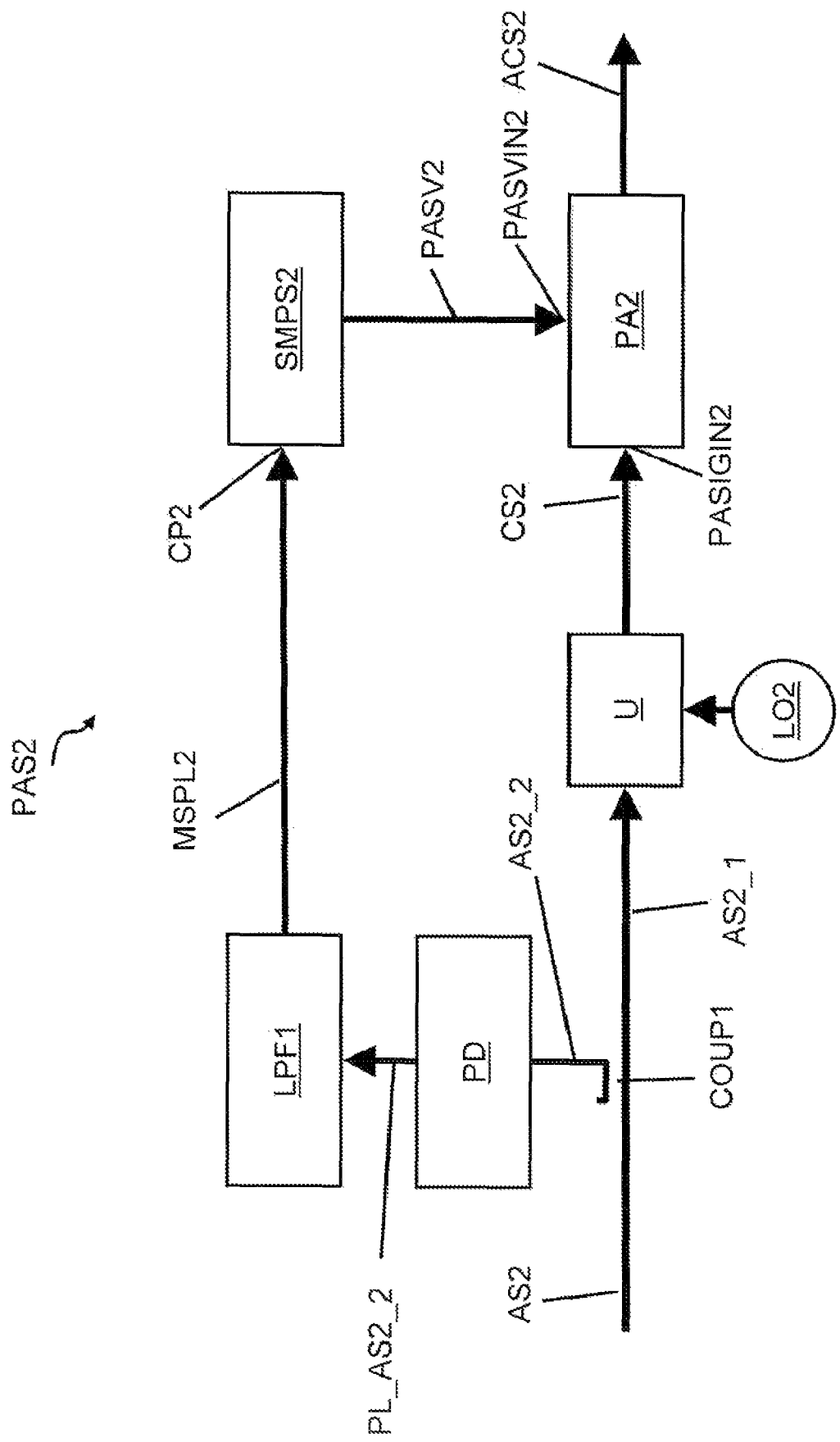
FIG. 3 shows a block diagram of a power amplifier system in accordance to a second application of the first embodiment of the invention.

FIG. 3 shows a block diagram of a power amplifier system PAS2 according to a second application of the first embodiment of the invention. The power amplifier system PAS2 comprises a coupler COUP1, a power detector PD, a low-pass filter LPF1, an upconversion unit U, a local oscillator LO2, a power supply SMPS2, and a power amplifier PA2. The power amplifier system PAS2 may be contained in a transmitter of a network element of a radio communication system such as an LTE system, a WiMAX system, or a WLAN system.

The network element may be for example a base station. Further alternatives for the network element are a mobile phone, a PDA, a notebook, a USB flash drive with a radio interface etc.

In an alternative, the power amplifier system PAS2 may be contained in an audio of video system such as a hi-fi system and the power amplifier system PAS2 may not comprise the upconversion unit U and the local oscillator LO2.

A signal path of an analogue input signal AS2 is connected to an input interface of the coupler COUP1.

The coupler COUP1 splits the analogue signal AS2 in a first signal fraction AS2_1 and a second signal fraction AS2_2 regarding a splitting factor, A power level of the first signal fraction AS2_1 is above a power level of the second signal fraction AS2_2.

Output interfaces of the coupler COUP1 are connected to an input interface of the upconversion unit U for the first signal fraction AS2_1 and to an input interface of the power detector PD for the second signal fraction AS2_2. The local oscillator LO2 is connected to a further input interface of the upconversion unit U.

An output interface of the upconversion unit U for a carrier signal CS2 is connected to a signal input interface PASIGIN2 of the power amplifier PA2. The power detector PD measures the second signal fraction AS2_2 and generates a power level signal PL_AS2_2 according to a signal power of the second signal fraction AS2_2. The power detector PD may be a high-bandwidth power detector.

An output interface of the power detector PD is connected to an input interface of the low-pass filter LPF1.

The low-pass filter LPF1 generates a voltage MSPL2 related to the mean signal power of the second signal fraction AS2_2.

An output interface of the low-pass filter LPF1 is connected to a control port CP2 of the power supply SMPS2.

In an alternative, a low-bandwidth power detector may be used to measure the second signal fraction AS2_2 and may be used to generate the value related to the mean signal power of the second signal fraction AS2_2. This provides the advantage of not requiring the low-pass filter LPF1.

The control port CP2 of the power supply SMPS2 may be an analogue control port.

In on alternative, the control port CP2 may be a digital control port and a ADC (ADC=analogue-to-digital converter) may be used between the low-pass filter LPF1 and the power supply SMPS2 to convert analogue values coming from the low-pass filter LPF1 to digital values.

In a further alternative, the control port CP2 may require a control language and the ADC may be combined with a digital processing unit to calculate values of a control parameter of the control language.

The power supply SMPS2 may be a switched-mode power supply providing the advantage of generating a supply voltage PASV2 at different power levels with a same high efficiency.

The power supply SMPS2 adapts a value of the supply voltage PASV2 to the value MSPL2 related to a mean signal power of the analogue input signal AS2.

An output interface for the supply voltage PASV2 of the power supply SMPS2 is connected to as voltage input interface PASVIN2 of the power amplifier PA2.

The power amplifier PA2 amplifies the carrier signal CS2 to an amplified carrier signal ACS2 based on the adapted value of the supply voltage PASV2.

The power amplifier system PAS2 according to the second application of the first embodiment of the invention provides the advantage of increasing a power efficiency of the power amplifier PA2 and thereby reducing the overall power consumption of the analogue power amplifier system PAS2.

Figure 4:
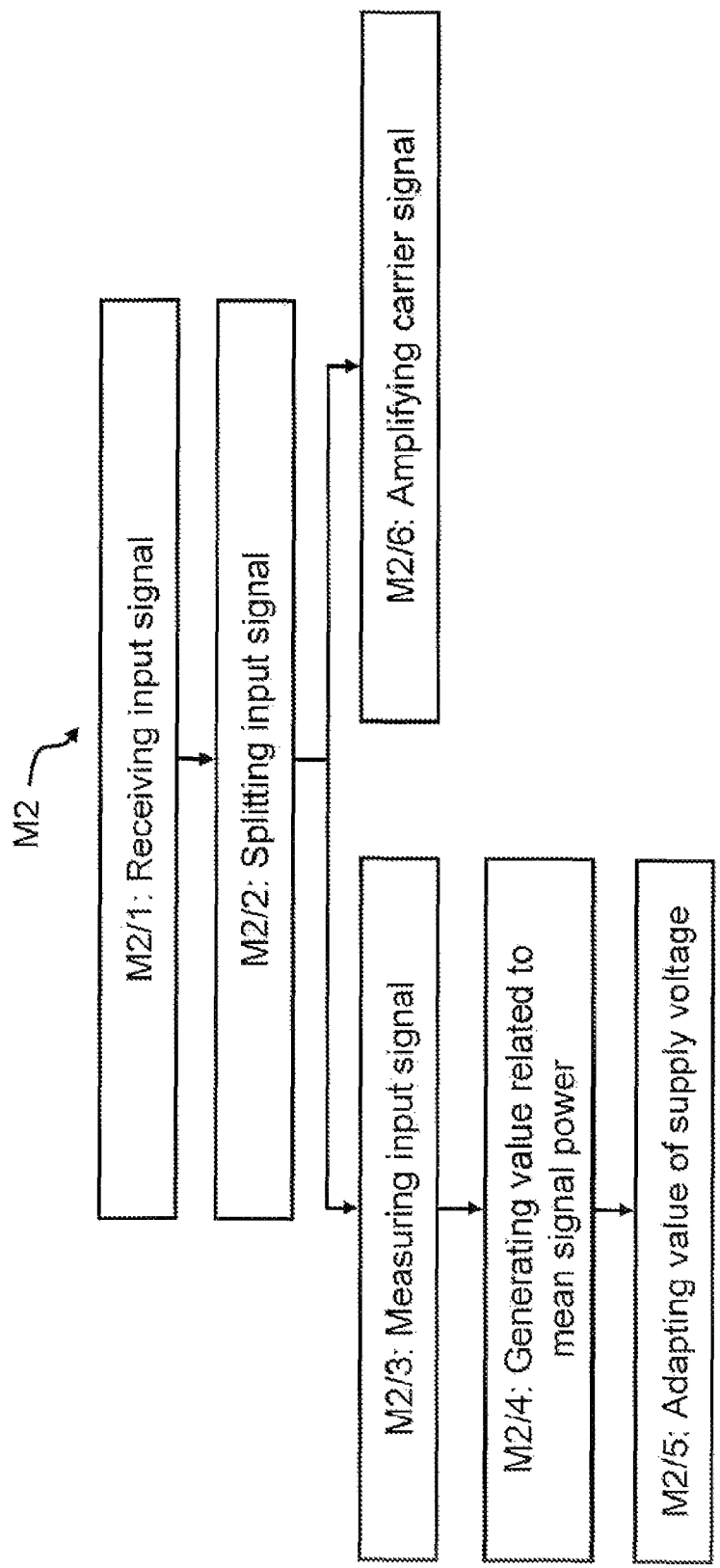
FIG. 4 shows a flow diagram of a method in accordance to the second application of the first embodiment of the invention.

Referring to FIG. 4 a flaw diagram of a method M2 in accordance to, the second application of the first embodiment of the invention is shown. The sequence and the number of the steps for performing the method M2 is not critical, and as can be understood by those skilled in the art, that the sequence and the number of the steps may vary without departing from the scope of the invention.

In a first step M2/1, the analogue input signal AS2 is received by the power amplifier system PAS2.

The step M2/1 is continuously performed.

In a next step M2/2, the coupler COUP) continuously splits the analogue input signal AS2 into the first and the second signal fraction AS2_1, AS2_2.

In a further step M2/3, the power detector PD continuously measures the signal power of the second signal fraction AS2_2 and generates the power level signal PL_AS2_2.

In a next step M2/4, the low-pass filter LPF1 continuously generates the voltage MSPL2 related to the mean signal power of the second signal fraction AS2_2 by smoothing abrupt variations of the power level signal PL_AS2_2.

In a further step M2/5, a value of the voltage PASV2 of the power amplifier PA2 is continuously adopted to the voltage MSPL2 related to the mean signal power of the analogue input signal AS2 taking into account the splitting factor of the coupler COUP1.

In a first alternative, the voltage MSPL2 related to the mean signal power of the second signal fraction AS2_2 is directly applied to the control port CP2 of the voltage supply SMPS2 and the voltage supply SMPS2 determines the value of the supply voltage PASV2 for example by using a look-up table of the voltage supply SMPS2.

In a second alternative, the voltage MSPL2 related to the mean signal power of the second signal fraction AS2_2 is converted to a parameter value of the control port CP2 by a further converting unit.

In a further step M2/6, which is executed continuously and in parallel to the steps M2/3, M2/4, and M2/5, the power amplifier PA2 amplifies the carrier signal CS2 to an amplified carrier signal ACS2 based on the adapted value of the supply voltage PASV2.

In a first sub-step, the first signal fraction AS2_1 of the analogue input signal AS2 is applied to the input interface of the upconversion unit U.

In a further sub-step, the upconversion unit U converts the first signal fraction AS2_1 to the carrier signal CS2 by mixing the first signal fraction AS2_1 with a frequency signal of the local oscillator LO2.

In a final sub-step, the carrier signal CS2 is amplified to the amplified carrier signal ACS2 in accordance to the supply voltage PASV2 of the power amplifier PA2.

The amplified carrier signal ACS2 is transmitted to an antenna, which is connected to an output interface of the power amplifier PA2.

In an alternative, the amplified carrier signal ACS2 may be inserted a fixed transmission line.

In a further alternative, the amplified carrier signal ACS2 may be transmitted to loudspeakers of an audio or video system.

The method M2 according to the present invention offers a benefit of reducing the power consumption of the power amplifier PA2, because a CD bias current of the power amplifier PA2 is always limited to a value, which is sufficient to amplify the carder signal CS2 having a power level related to the signal power level of the analogue input signal AS2.

Furthermore, the overall power consumption of the power amplifier system PAS2 is reduced.

Figure 5:
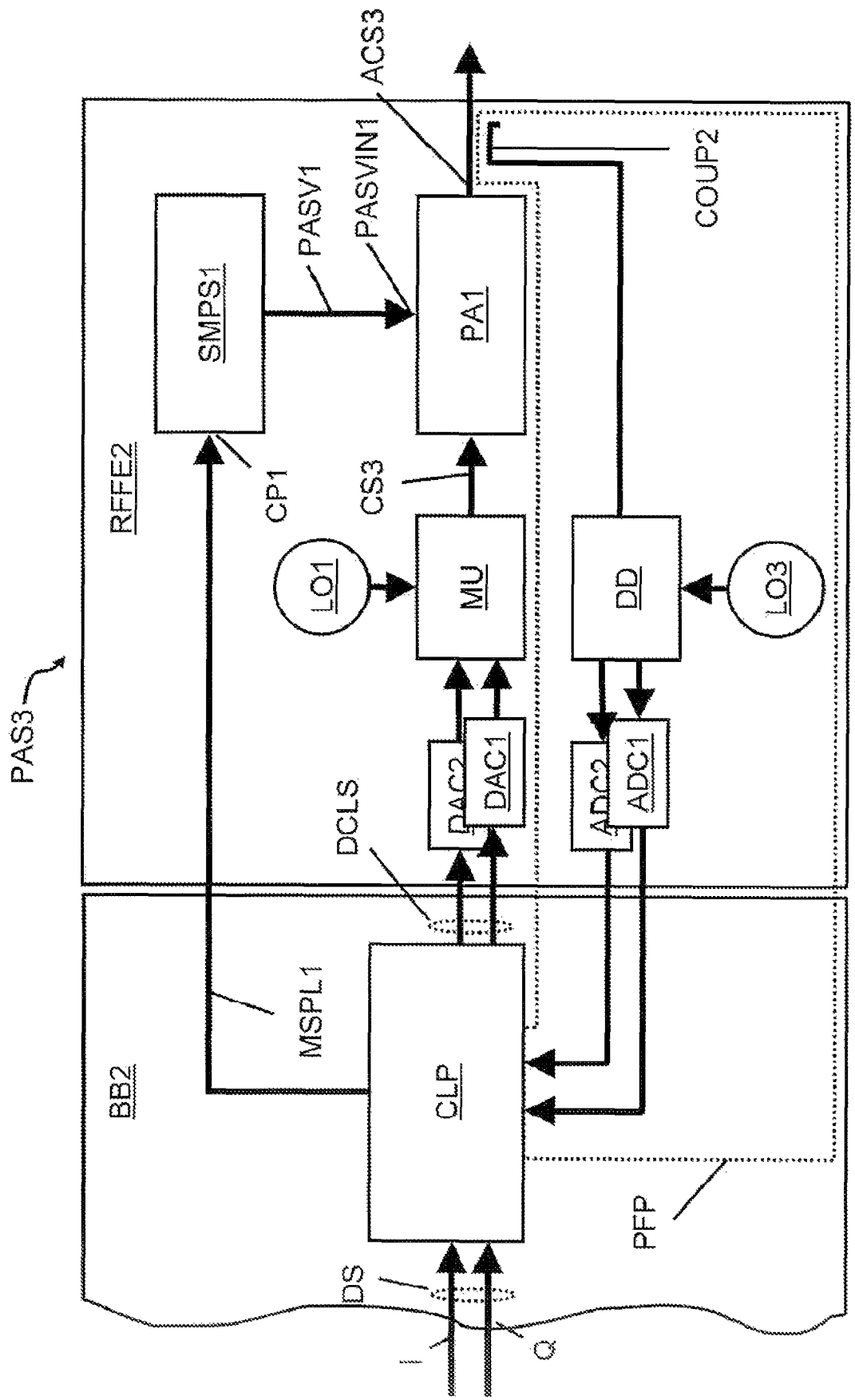
FIG. 5 shows a block diagram of a power amplifier system in accordance to a first application of a second embodiment of the invention.

Referring to FIG. 5 a block diagram of a power amplifier system PAS3 according to a first application of a second embodiment of the invention is shown.

In comparison to the power amplifier system PAS1 shown in FIG. 1, the power amplifier system PAS3 comprises instead of the adaptation unit ADU a clipping unit CLP with a clipping and a predistortion functionality.

The clipping unit CLP further comprises the functionalities of the adaptation unit ADU according to FIG. 1.

In an alternative, an additional adaptation unit may comprise the functionalities of the adaptation unit ADU according to FIG. 1 and may interact with the clipping unit CLP.

Furthermore, the power amplifier system PAS3 comprises a predistortion feedback path PFP with a coupler COUP2, a demodulation and downconversion unit DD, a further local oscillator LO3 and two ADCs ADC1, ADC2.

The clipping unit CLP being located on a portion of a digital baseband board BB2 may be a DSP (DSP=digital signal processor) or an FPGA (FPGA=field-programmable gate array).

In an alternative, the clipping unit CLP may be located on as further digital baseband board.

The predistortion functionality provides the advantage of getting a more linear power amplifier PA1 by increasing a linear amplification range towards higher output power and thereby reducing spectral distortion a an amplified carrier signal ACS3.

In on alternative, if a linearity of a power amplification of the power amplifier PA1 may be sufficient, the power amplifier system PAS3 may not comprise the predistortion feedback path PFP and the clipping unit CLP may not comprise the predistortion functionality.

In a further alternative, the clipping and the predistortion functionality are located in separate units on the portion of the digital baseband board BB2. Signal paths of the inphase and quadrature signal parts I, Q of the digital input signal DS are connected to input interfaces of the clipping unit CLP.

Output interfaces of the clipping unit CLP for inphase and quadrature signal parts I, Q of a digital clipping signal DCLS are connected to the input interfaces of the two DACs DAC1, DAC2.

The clipping functionality of the clipping unit CLP limits signal peaks of the digital input signal DS according to a clipping threshold, which is determined by the value MSPL1 related to the mean signal power. Thereby a PAPR (PAPR=peak-to-average-power-ratio) of the digital input signal DS is kept within a predefined range.

Figure 6:
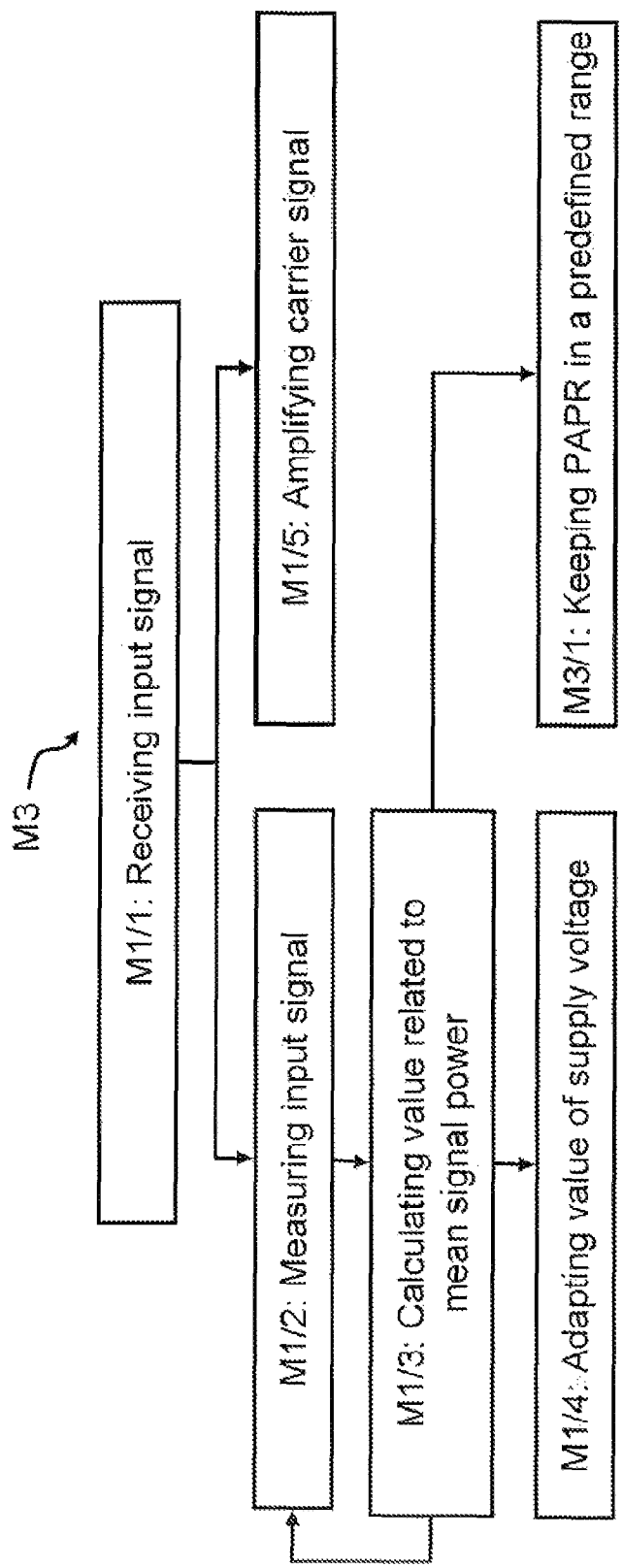
FIG. 6 shows a flow diagram of a method in accordance to the first application of the second embodiment of the invention.

Referring to FIG. 6 a flow diagram of a method M3 in accordance to the first application of the second embodiment of the invention is shown. In addition to the steps M1/1, M1/2, M1/3, M1/4, and M1/5 performed in the first application of the first embodiment of the invention, step M3/1 may be performed in parallel to the step M1/4.

The sequence and the number of the steps for performing the method M3 is not critical, and as can be understood by those skilled in the art, that the sequence and the number of the steps may vary without departing from the scope of the invention.

In the step M3/1, the clipping unit CLP keeps the PAPR of the digital input signal DS in the predefined range. Therefore, the clipping unit CLP uses the value MSPL1 related to the mean signal power to adjust the clipping threshold according to the predefined range and thereby generating the digital clipping signal DCLS. All signal peaks of the digital input signal DS exceeding the clipping threshold are flattened or levelled to the clipping threshold.

In a first alternative, a so-called hard clipping may be performed by simply levelling all signal values to the clipping threshold. In that case, a characteristic curve of the digital clipping signal DCLS may comprise sharp edges (see FIGS. 9 and 10).

In a preferred second alternative, a so-called soft clipping may be performed by smoothing the characteristic curve of the digital clipping signal DCLS at clipped signal peaks. This provides the advantage of avoiding a generation of harmonic waves and avoiding a broadening of a frequency bandwidth of the digital clipping signal DCLS by the harmonic waves.

In a further preferred alternative, a signal envelope of the digital clipping signal DCLS may exceed slightly the clipping threshold due to the soft clipping.

In the step M1/5 a futility sub-step is executed in comparison to the method M1. In the further sub-step, the clipping unit CLP modifies the digital input signal DS based on a feedback information received via the predistortion feedback path PFP.

In an alternative, the further sub-step may be not executed, if the power amplifier system may no comprise the predistortion path.

By the method M3 according to the first application of the second embodiment of the invention, a predetermined clipping threshold is applied to the digital input signal DS according to a predetermined mean signal power. Generally, for an increasing mean signal power an increasing clipping threshold and for a decreasing mean signal power a decreasing clipping threshold is applied to the digital input signal DS.

This provides the advantage of avoiding a saturation of the amplification of the power amplifier PA3 by signal peaks with a signal power much larger than the mean signal power. Furthermore, distortions of the output signal of the power amplifier PA3 such as generation of additional sidebands caused by the saturation of the amplification can be prevented. The predefined range can be selected in such a way, that requirements such as given by a radio communication standard regarding signal integrity are fulfilled.

Figure 7:
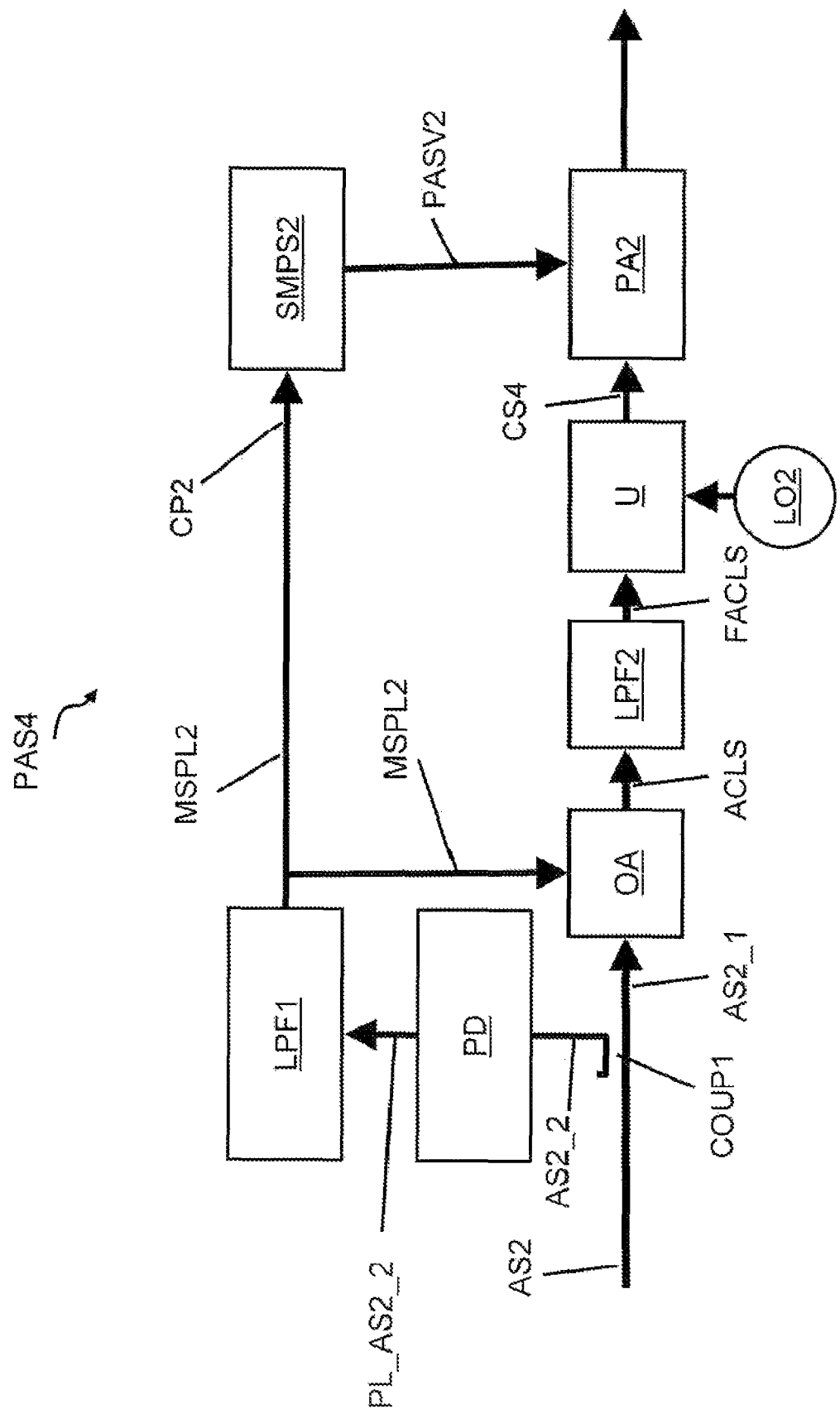
FIG. 7 shows a block diagram of a power amplifier system in accordance to a second application of the second embodiment of the invention.

Referring to FIG. 7 a block diagram of a power amplifier system PAS4 according to a second application of a second embodiment of the invention is shown.

In comparison to the power amplifier system PAS2 shown in FIG. 3, the power amplifier system PAS4 additionally comprises an operational amplifier OA and a further low-pass filter LPF2.

The voltage MSPL2 related to the mean signal power, which is generated by the low-pass filter LPF1 and applied to the control port CP2 of the power supply SMPS2, is used in addition as a supply voltage for the operational amplifier OA.

The operational amplifier OA comprises an input interface for the first signal fraction AS2_1 of the analogue signal AS2, an interface for the voltage MSPL2 as the supply voltage for the operational amplifier OA, and an output interface for an analogue clipping signal ACLS.

In an alternative, a transistor may by used instead of the operational amplifier OA.

The operational amplifier OA limits signal peaks of the first signal fraction AS2_1 of the analogue input signal AS2 to a further clipping threshold, which is determined by the value MSPL2 related to the mean signal power. Thereby the PAPR (PAPR=peak-to-average-power-ratio) of the first signal fraction AS2_1 of the analogue input signal AS2 is kept within a predefined range.

In an alternative, a voltage divider may be used to generate via the voltage MSPL2 a reduced supply voltage for the operational amplifier OA.

In a further alternative, a further operational amplifier may be used to generate via the voltage MSPL2 an amplified supply voltage for the operational amplifier CSA.

In an even further alternative, a further voltage divider or an even further operational amplifier may be used between the low-pass filter LPF1 and the power supply SMPS2 to adapt the voltage MSPL2 to a voltage required by the control part CP2 of the power supply SMPS2.

The further low-pass filter LPF2 comprises an input interface for the analogue clipping signal ACLS and an output interface for a filtered analogue clipping signal FACLS, which is applied to the input interface of the upconversion unit U.

The further low-pass filter LPF2 removes spectral components of the analogue clipping signal ACLS, which have been generated by a clipping process of the operational amplifier OA.

In an alternative, the power amplifier system PAS4 may not comprise the further low-pass filter LPF2, if the operational amplifier OA may not generate additional spectral components of the analogue clipping signal ACLS by the clipping process.

Figure 8:
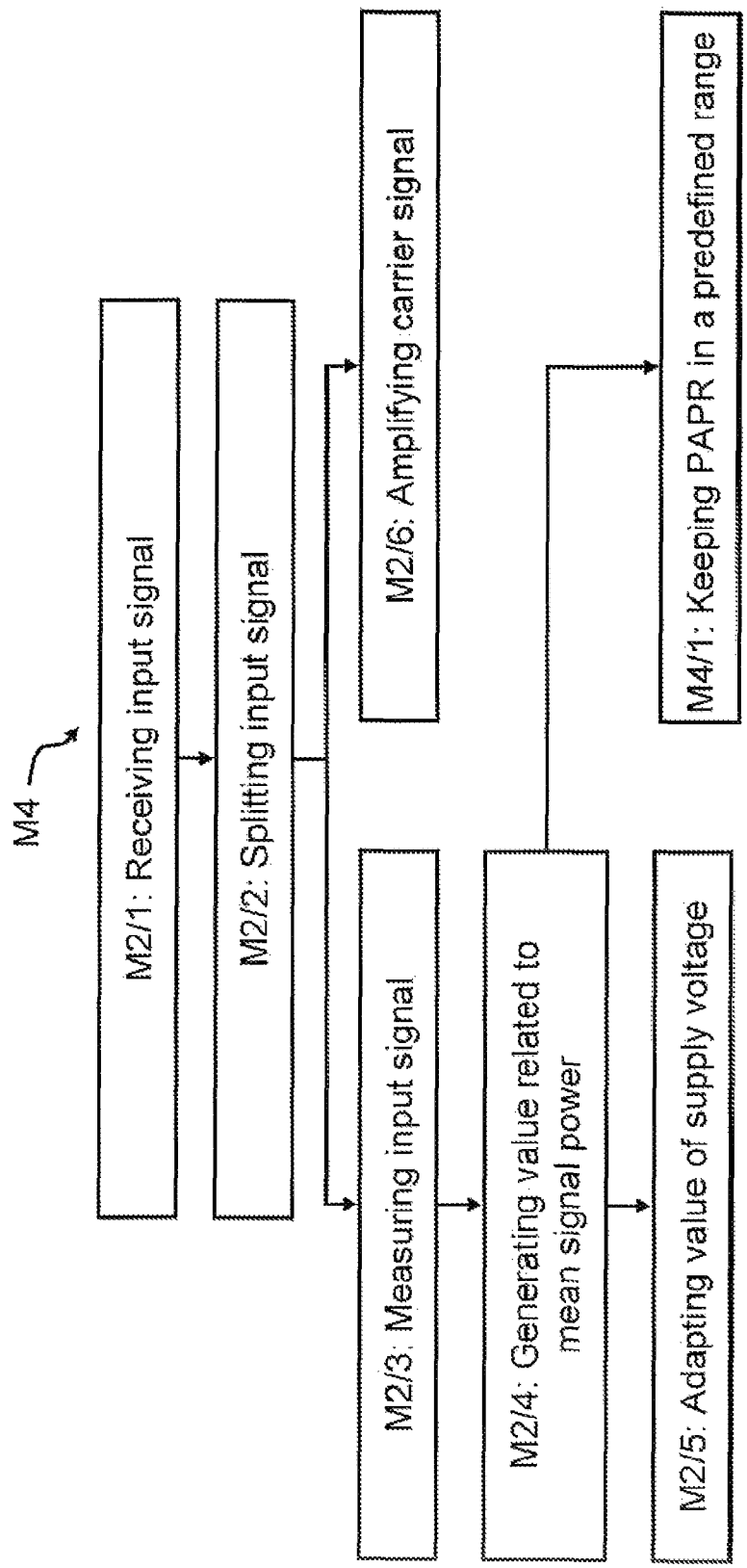
FIG. 8 shows a flow diagram of a method in accordance to the second application of the second embodiment of the invention.

Referring to FIG. 8 a flow diagram of a method M4 in accordance to the second application of the second embodiment of the invention is shown. In addition to the steps M2/1, M2/2, M2/3, M2/4, M2/5, and M2/6 performed in the second application of the second embodiment of the invention, step M4/1 may be performed in parallel to the step M2/5.

The sequence and the number of the steps for performing the method M4 is not critical, and as can be understood by those skilled in the art, that the sequence and the number of the steps may vary without departing from the scope of the invention.

In the step M4/1, the operational amplifier OA keeps the PAPR of the second fraction AS2_1 of the analogue input signal AS2 in a further predefined range and generates the analogue clipping signal ACLS. Therefore, the operational amplifier OA works as a limiter in an operating point, which amplifies the first fraction AS2_1 of the analogue input signal AS2 below the further clipping threshold by a factor one and which works in a saturation mode for signal peaks exceeding the further clipping threshold and thereby flattening or levelling the signal peaks of the first fraction AS2_1 to the clipping threshold. The operating point is set by the voltage MSPL2.

In the step M2/5, a further sub-step is executed. In the further sub-step, the further low-pass filter LPF2 removes signal parts of the analogue clipping signal ACLS, which have been generated by the clipping process of the operational amplifier OA. By using a predefined bandwidth of the further low-pass filter LPF2, a signal quality of the filtered analogue clipping signal FACLS can be increased.

In an alternative, the further sub-step may not be executed, if the operational amplifier OA may not generate additional spectral components of the analogue clipping signal ACLS by the clipping process.

The method M4 according to the second application of the second embodiment of the invention provides the advantage of avoiding a saturation of the amplification of the power amplifier PA4 by signal peaks with a signal power much larger than the mean signal power. Furthermore, distortions of the output signal of the power amplifier PA4 such as generation of additional sidebands caused by the saturation of the amplification can be prevented.

Figure 9:
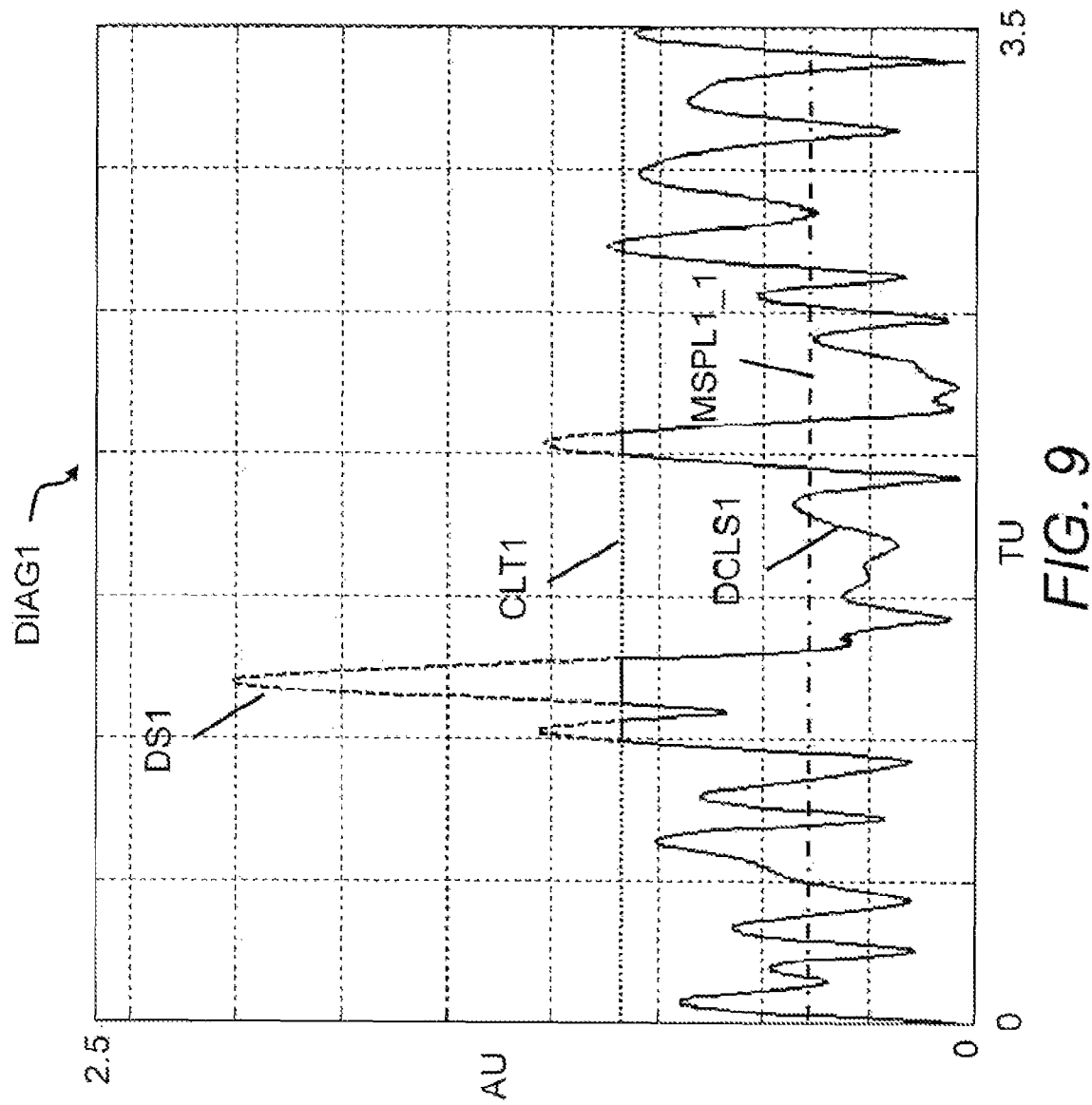
FIG. 9 shows a first characteristic diagram in accordance to the second embodiment of the invention.
Figure 10:
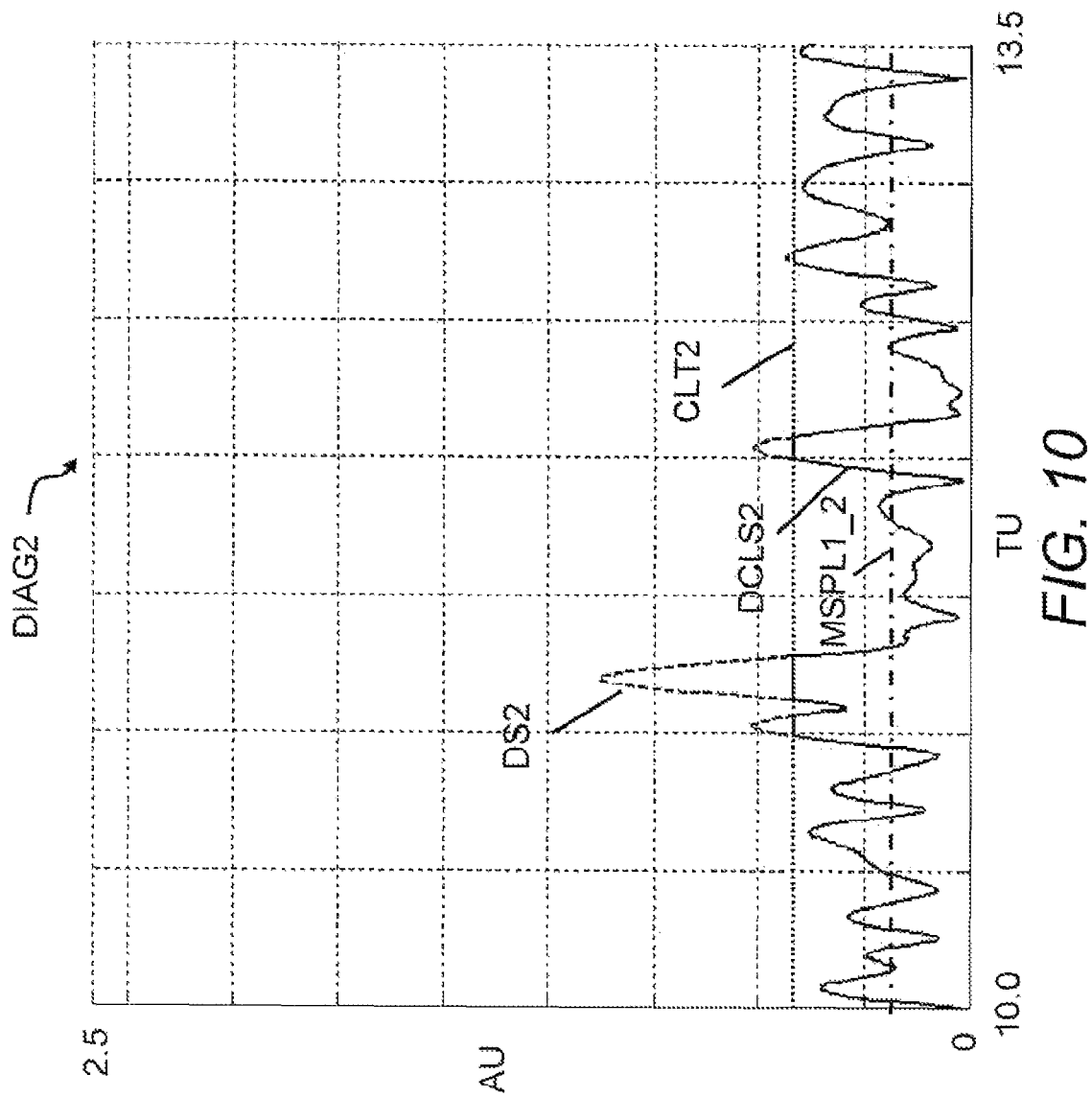
FIG. 10 shows a second characteristic diagram in accordance to the second embodiment of the invention.

Referring to FIG. 9 and FIG. 10, the step M3/1 of keeping the PAPR of the digital input signal DS within the predefined range is illustrated for two different time intervals.

According to FIG. 9, a first characteristic diagram DIAG1 shows a first digital input signal DS1 with a dashed line and a first digital clipping signal DCLS1 with a solid line both with amplitudes of arbitrary amplitude units AU as a function of time with arbitrary time units TU. The arbitrary time units comprise a first time interval [0, 3.5] and the arbitrary amplitude units comprise an amplitude interval [0, 2.5]

The solid line of the first digital clipping signal DCLS1 covers the dashed line of first digital input signal DS1 below a first clipping threshold CLT1. The first characteristic diagram DIAG1 further shows a first amplitude value MSPL1_1 related to the mean signal power of die first digital input signal DS1, which has been calculated in the step M1/3 of the method M1.

The first amplitude value MSPL1_1 is used in the step M3/1 of the method M3 to calculate the first clipping threshold CLT1 and to keep the PAPR of the first digital input signal DS1 in the predefined range. Therefore, first signal peaks of the dashed line of the first digital input signal DS1 above the first clipping threshold CLT1 are removed and a flat curve progression at a first level of the first clipping threshold CLT is generated instead of the first signal peaks.

According to FIG. 10, a second characteristic diagram DIAG2 shows a second digital input signal DS2 with a dashed line and a second digital clipping signal DCLS2 with a solid line both with amplitudes of arbitrary amplitude units AU as a function of time with arbitrary time units TU. The arbitrary time units comprise a second time interval [10, 13.5] and the arbitrary amplitude units comprise the amplitude interval [0, 2.5]

The solid line of the second digital clipping signal DCLS2 covers the dashed line of second digital input signal DS2 below a second clipping threshold CLT2.

The second characteristic diagram DIAG2 further shows a second amplitude value MSPL1_2 related to the mean signal power of the second digital input signal DS2, which has been calculated in the step M1/3 of the method M1.

The second amplitude value MSPL1_2 is used in the step M3/1 of the method M3 to calculate the second clipping threshold CLT2 and to keep the PAPR of the second digital input signal DS2 in the predefined range.

Therefore, second signal peaks of the dashed line of the second digital input signal DS2 above the second clipping threshold CLT2 are removed and a flat curve progression at a second level of the second clipping threshold CLT is generated instead of the second signal peaks.

Second signal peaks, the second clipping threshold CLT2 and the second amplitude value MSPL1_2 related to the mean signal power of the second digital input signal DS2 are below the corresponding values of the first digital input signal DS1 shown in FIG. 9.

Due to second amplitude value MSPL1_2 being below the first amplitude value MSPL1_1 and due to the predefined range of the PAPR, the second clipping threshold CLT2 of the second time interval [10, 13.5] is below the first clipping threshold CLT1 of the first time interval [0, 3.5].

Figure 11:
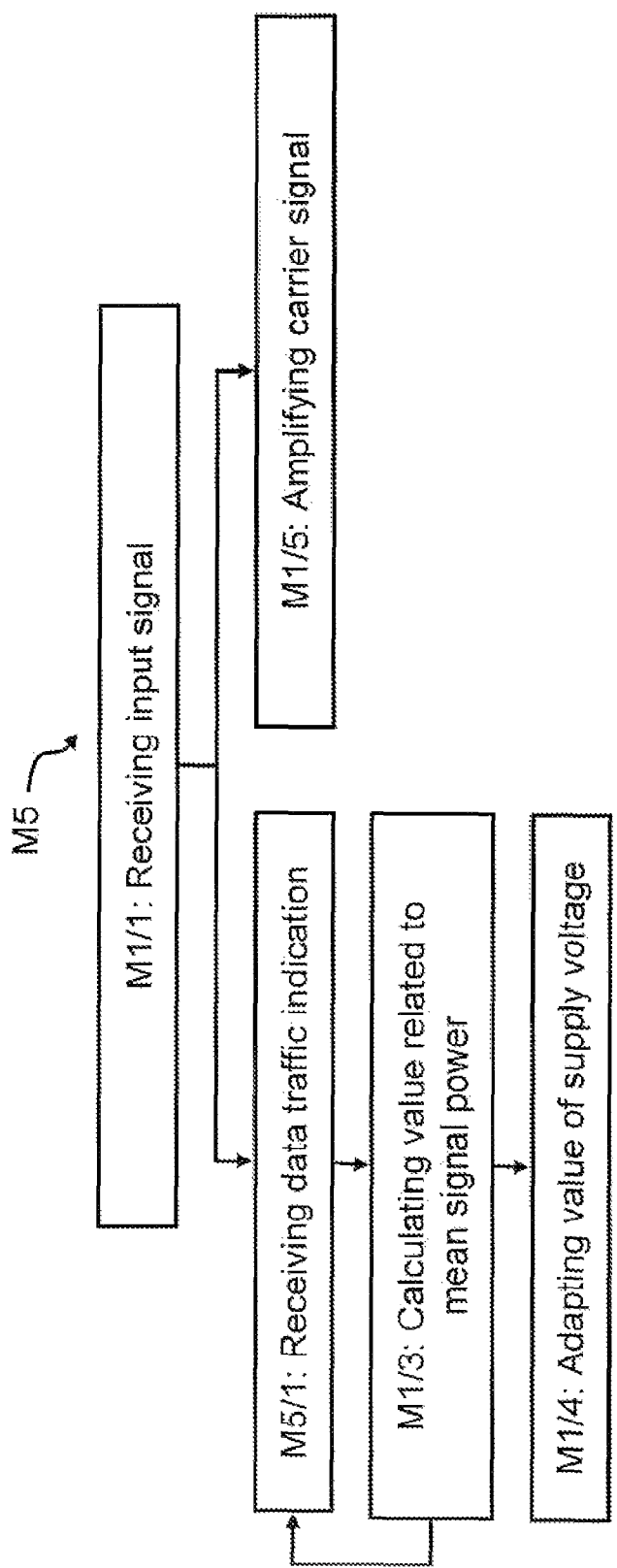
FIG. 11 shows a flow diagram of a method in accordance to a third embodiment of the invention.

Referring to FIG. 11 a flow diagram of a method M5 in accordance to a third embodiment of the invention is shown. In addition to the steps M1/1, M1/3, M1/4, and M1/5 performed according to the first application of the first embodiment of the invention, step M5/1 may be performed instead of the step M1/2.

In an alternative, the step M5/1 may be performed in parallel to the step M1/2.

In the step M5/1, a data traffic indication is received at the adaptation unit ADU from a higher-layer entity.

In a first alternative, the higher-layer entity may be a MAC scheduler (MAC=medium access control) and the data traffic indication comprises a number of data packets or a number of bytes waiting in a queue of the MAC scheduler.

In a second alternative, the higher-layer entity may be a network layer entity and the data traffic indication comprises types and number of services currently in use such as video streaming services and coding rates of the video streaming services.

In a third alternative, the higher layer entity may be a HARQ entity (HARQ=hybrid automatic repeat-request) and the data traffic indication comprises an amount of ED information (ED=error-detection information) or FEC information (forward error correction) added to user or signalling data.

In the step M1/3, the adaptation unit ADU may comprise a look-up table to estimate data traffic according to the received data traffic indication and to calculate the value MSPL1 related to the mean signal power of the estimated data traffic.

The method M5 in accordance to the third embodiment of the invention provides the benefit of a timely adaptation of the supply voltage PASV1 in advance, before the digital input signal DS of the physical layer is increased by a fast alteration of the user traffic or the signalling traffic volume.

Figure 12:
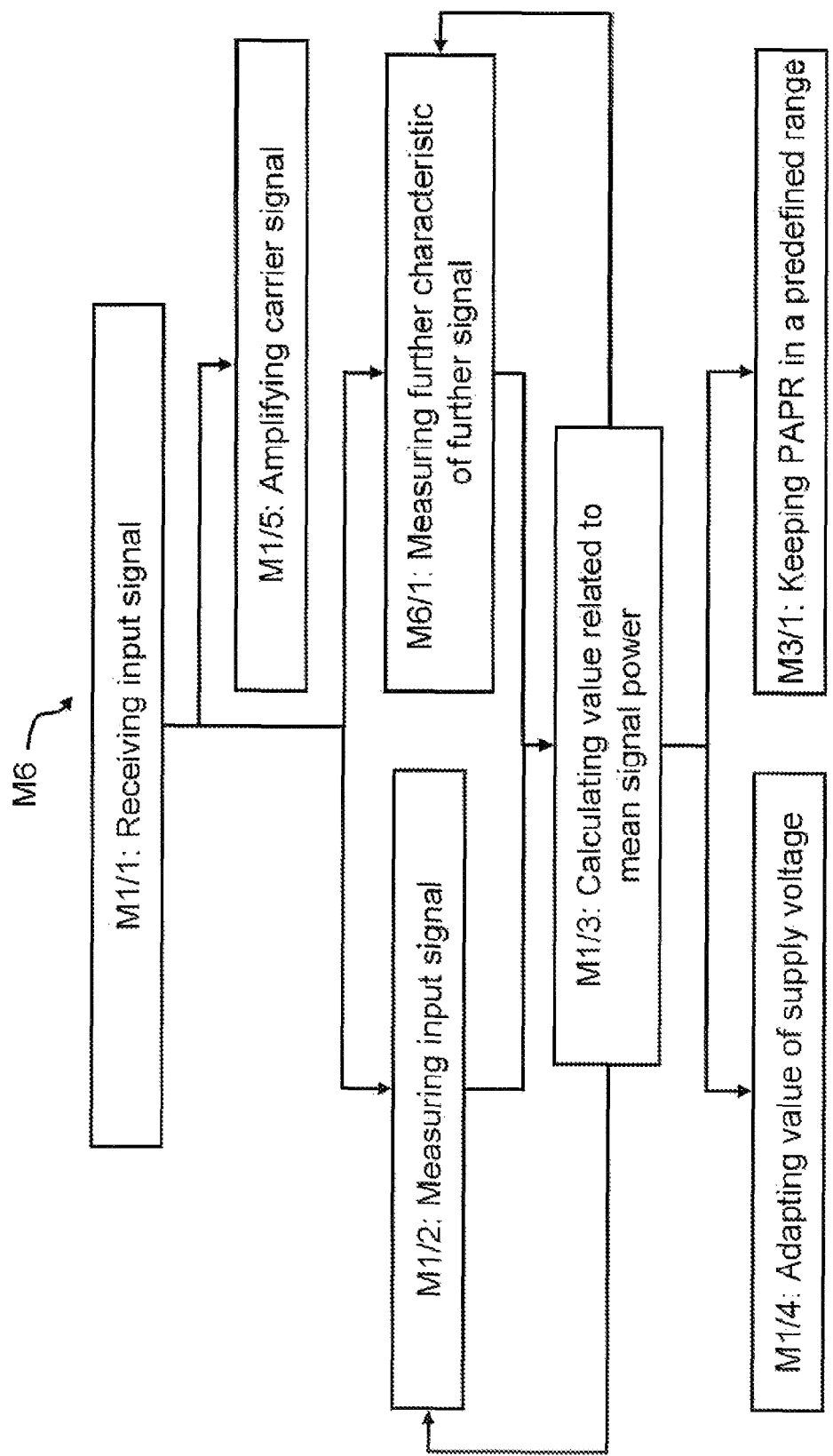
FIG. 12 shows a flow diagram of a method in accordance to a fourth embodiment of the invention.

Referring to FIG. 12 a flow diagram of a method M6 in accordance to a fourth embodiment of the invention is shown. In addition to the steps M1/1, M1/2, M1/3, M3/1, M1/4, and M1/5 performed according to the first application of the second embodiment of the invention, step M6/1 may be performed in parallel to the step M1/2.

The sequence and the number of the steps for performing the method M6 is not critical, and as can be understood by those skilled in the art, that the sequence and the number of the steps may vary without departing from the scope of the invention.

In the step M6/1, at least one value of at least one further characteristic of at least one further signal may be measured and the at least one further characteristic may be a quality indicator of the at least one further signal. In a first alternative, the at least one further characteristic may be an SNR (SNR=signal-to-noise-ratio) and the at least one further signal may be the digital input signal DS, the digital clipping signal DCLS or the amplified carrier signal ACS3.

In a second alternative, the at least one further characteristic may be a so-called EVM (EVM=error vector magnitude) and the at least one further signal may be the digital input signal DS, the digital clipping signal DCLS or the amplified carrier signal ACS3.

In a third alternative, the at least one further characteristic may be a spectral characteristic and the at least one further signal may be the digital input signal DS, the digital clipping signal DCLS or the amplified carrier signal ACS3.

The step M6/1 may be repeated continuously or within a third predefined time interval after the step M1/3.

For measuring the SNR, the EVM and the spectral characteristic of the amplified carrier signal ACS3 the predistortion feedback path PFP may be used.

In a further alternative, the SNR along with the EVM, the SNR along with the spectral characteristic, the EVM along with the spectral characteristic, or the SNR along with the EVM and the spectral characteristic may be measured at a same time.

By measuring the value of the at least one further characteristic of the digital input signal DS and of the digital clipping signal DCLS an impact of the clipping process on signal quality of the digital clipping signal DCLS con be determined.

By measuring the value of the at least one further characteristic of the digital input signal DS and of the amplified carrier signal ACS3 an impact of the clipping process in combination with the amplification process on signal quality of the amplified carrier signal ACS3 can be determined.

In the step M1/3, the value MSPL1 related to the mean signal power is calculated depending on the digital input signals measured in the step M1/2 and depending on the at least one further characteristic measured in the step M6/1 for example by adding a correction factor to the value related to the mean signal power being calculated by using only the digital input signals measured in the step M1/2. The correction factor may be positive or negative.

In the step M1/4, the supply voltage PASV1 may be adapted according to the value MSPL1 related to the mean signal power and according to the value of the at least one further characteristic to fulfil requirements (e.g. peak code domain error) of a radio communication standard such as UMTS or LTE. Therefore, the SNR, EVM, and spectral characteristic of the amplified carrier signal ACS3 may be used to fine-tune the supply voltage PASV1, which might have been roughly adjusted by the value MSPL1 related to the mean signal power.

In the step M3/1, the PAPR may be kept in the predefined range according to the value MSPL1 related to the mean signal power and according to the value of the at least one further characteristic to fulfil the requirements of the radio communication standard. Thereby, a fine-tuning of the clipping threshold CLT1, CLT2 can be performed.

The method M6 in accordance to the fourth embodiment of the invention provides the advantage of adjusting the supply voltage and/or the clipping threshold in a more accurate way, so that the signal quality of the amplified carrier signal ACS3 can be optimised and signal integrity required by the radio communication standard con be fulfilled.

Figure 13:
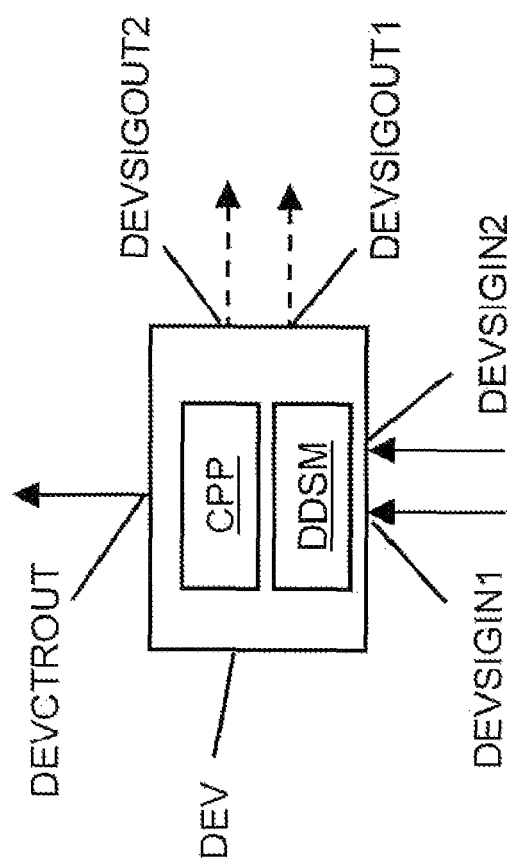
FIG. 13 shows a block diagram of a device in accordance to the first, second, third, and fourth embodiment of the invention.

Referring to FIG. 13 a device DEV may comprise a computer program product CPP, a digital data storage medium DDSM, two signal input interfaces DEVSIGIN1, DEVSIGIN2, two signal output interfaces DEVSIGOUT1, DEVSIGOUT2, and a control output interface DEVCTROUT.

In an alternative, the device may comprise one signal input interface and one signal output interface.

The device DEV may comprise the adaptation unit ADU according to FIG. 1 or the clipping unit CLP according to FIG. 5.

The device DEV may be an FPGA, a CPLD, an ASIC or a DSP.

The computer program product CPP comprises computer-executable instructions for performing the method M1 comprising the step M1/4 of adapting the value of the supply voltage PASV1, PASV3 of the power amplifier PA1 to the value related to the mean signal power of the digital input signal DS of the power amplifier system PAS1, PAS3.

In an alternative, the computer program product may be a hardware configuration such as used by an FPGA for performing the method M1 comprising the step M1/4 of adapting the value of the supply voltage PASV1, PASV3 of the power amplifier PA1 to the value related to the mean signal power of the digital input signal DS of the power amplifier system PAS1, PAS3.

The digital data storage medium DDSM encodes a machine-executable program of instructions to perform the method M1 comprising the step M1/4 of adapting the value of the supply voltage PASV1, PASV3 of the power amplifier PA1 to the value related to the mean signal power of the digital input signal DS of the power amplifier system PAS1, PAS3.

In an alternative, the digital data storage medium DDSM may be a flash memory for storing the hardware configuration such as used by the FPGA. In an alternative, the digital data storage medium DDSM may be separated from the device DEV.

The invention claimed is:

1. A method for amplifying a carrier signal by using a power amplifier of a power amplifier system, the power amplifier is fed with a supply voltage of a power supply, said method comprising:
    adapting a value of said supply voltage to a value related to a mean signal power of an input signal of said power amplifier system said adapting of said supply voltage being performed with a value of an ascending slope being above an absolute value of a downward slope; and
    limiting signal peaks of said input signal according to a clipping threshold, said clipping threshold being determined by said value related to said mean signal power.

2. The method according to claim 1, wherein said input signal is a digital input signal or an analogue input signal.

3. The method according to claim 1, said method further comprising:
    measuring at least one value of at least one further characteristic of at least one further signal, and said at least one further characteristic is a quality indicator of said at least one further signal.

4. The method according to claim 3, wherein said supply voltage further depends on said at least one value of said at least one further characteristic.

5. The method according to claim 3, wherein a peak-to-average-power-ratio of the power amplifier system depends on said at least one value of said at least one further characteristic.

6. The method according to claim 1, wherein said method further comprises receiving a data traffic indication from a higher-layer entity.

7. The method according to claim 1, said method further comprises:
- measuring values of said input signal with a first predefined time interval, and
- calculating said value related to said mean signal power using said values of said input signal measured within a second predefined time interval.

8. The method according to claim 7, wherein said value related to said mean signal power is a moving average with a lower weight according to said values of said input signal measured within a first part of said second predefined time interval and a higher weight according to said values of said input signal (DS) measured within a second part of said second predefined time interval and said first part of said second predefined time interval is followed by said second part of said second predefined time interval.

9. A power amplifier system comprising:
- a power amplifier with a first input interface for a carrier signal and a second input interface for a supply voltage, and
- a supply voltage adapter that is operative to adapt a value of said supply voltage to a value related to a mean signal power of an input signal of said power amplifier system, wherein said adapting of said supply voltage is performed with a value of an ascending slope being above an absolute value of a downward slope; and a peak limiter that is operative to limit signal peaks of said input signal according to a clipping threshold and wherein said clipping threshold is determined by said value related to said mean signal power.

10. A transmitter for use in a radio communication system comprising a power amplifier system according to claim 9.

11. A network element for use in a radio communication system comprising a transmitter according to claim 10.

12. Network element according to claim 11, wherein said network element is either of the following: base station, access point, mobile phone, PDA, notebook.

13. A transceiver for use in a fixed access communication system comprising a power amplifier system according to claim 9.

14. A computer program product implemented on a non-transitory computer readable medium comprising: computer-executable instructions for performing a method for amplifying a carrier signal by using a power amplifier of a power amplifier system, the method comprising: the step of
- adapting a value of a supply voltage of said power amplifier to a value related to a mean signal power of an input signal of said power amplifier system, wherein said adapting of said supply voltage is performed with a value of an ascending slope being above an absolute value of a downward slope; and
- limiting signal peaks of said input signal according to a clipping threshold said clipping threshold being determined by said value related to said mean signal power.

* * * * *